United States Patent [19]

Black

[11] Patent Number: 4,532,442
[45] Date of Patent: Jul. 30, 1985

[54] NOISE REDUCTION IN ELECTRONIC MEASURING CIRCUITS

[76] Inventor: Ian A. Black, Hunters Lodge, Beechwood La.,, Cooksbridge, Lewes, East Sussex, England

[21] Appl. No.: 435,205

[22] Filed: Oct. 19, 1982

[30] Foreign Application Priority Data

Oct. 23, 1981 [GB] United Kingdom ............... 8131996

[51] Int. Cl.³ .............................................. H03K 17/16
[52] U.S. Cl. .................................... 307/520; 307/494; 307/355; 328/163; 328/165
[58] Field of Search .............. 307/520, 542, 355, 356, 307/491, 493, 494; 328/53, 162, 163, 165, 133; 324/57 N, 123 R

[56] References Cited

U.S. PATENT DOCUMENTS

| | | | |
|---|---|---|---|
| 3,866,130 | 2/1975 | Krause | 307/355 X |
| 4,220,923 | 9/1980 | Pelchat et al. | 324/57 N |
| 4,263,549 | 4/1981 | Toppeto | 324/57 N X |
| 4,368,429 | 1/1983 | Jamison | 307/520 X |
| 4,378,605 | 3/1983 | Baumann, Jr. et al. | 324/57 N X |
| 4,392,378 | 7/1983 | Pitches et al. | 307/355 X |
| 4,393,347 | 7/1983 | Looper | 324/123 R X |

*Primary Examiner*—Stanley D. Miller
*Assistant Examiner*—D. R. Hudspeth
*Attorney, Agent, or Firm*—Beveridge, DeGrandi & Weilacher

[57] ABSTRACT

A method of noise reduction in electronic measuring circuits is provided wherein two discrete signals $(\overline{A},\overline{B})$ are separately established, each of which contains the same noise, and the signal $\overline{P}=\overline{A}-N\overline{B}$ is then established, where N is chosen to make $\overline{P}$ a minimum. The method is particularly useful in a method of pulse detection of the type wherein signals $(\overline{A})$ and $(\overline{B})$ obtained from two monitoring units $(M_1,M_2)$ in series with respective components $(C_A,C_B)$ are compared in a pulse discrimination device (P.D.S.) in order to detect the occurrence of out of phase pulses in the signals. In this event, increased detection sensitivity can be obtained by operating on the signals $(\overline{A})$ and $(\overline{B})$ by a difference amplifier arrangement $(A_3,A_4)$ to establish input signals $(\overline{P})$ and $(\overline{Q})$ for the pulse detection system given by:

$$P=(A-\alpha NB) \text{ and } Q=(NB-\alpha A)$$

where $\alpha$ lies in the range of 0.5 to 1.0 and N is chosen to make the difference signal $(\overline{A}-N\overline{B})$ a minimum.

5 Claims, 4 Drawing Figures

NOISE REDUCTION IN ELECTRONIC MEASURING CIRCUITS

DESCRIPTION

The present invention is concerned with the reduction of noise in electronic measuring circuits, particularly, but not exclusively, in such circuits used for detecting the presence of pulses.

One example where pulses are to be detected and recorded is in the testing of high-voltage components. In many components used in high-voltage equipment, such as capacitors, cables, bushings and transformers, it is necessary to be able to test such components for the phenomenon of "partial discharge" which occurs when an electrical discharge occurs which does not actually bridge the electrodes of the component but occurs within or around localised regions of the component, e.g. internal discharges in cavities in a dielectric, surface discharges along an insulator, and corona discharges around a sharp edge.

A method of testing an electrical component for partial discharges is described in GB Patent Specification No. 1,425,825 in which a component to be tested is connected to a high voltage source in series with a first series impedance, a second, reference component being connected to the same high voltage source in series with a second series impedance. The technique operates by taking a signal from each series impedance, amplifying these signals and then comparing the amplified signals in a comparator. Any discharge pulse originating in the sample under test will give rise to pulses in the two amplifiers of opposite polarity, whereas any signal entering the circuit from outside will cause signals of the same polarity. The comparator is arranged to react only to signals of opposite polarity to provide a record of discharges in the test sample. The latter system is referred to hereinafter as the P.D.S. (Pulse Discrimination System).

The sensitivity of any pulse detection or partial discharge detection system is limited by the presence of radio frequency interference (noise) occurring within the passband of the amplifier(s) being used. This is equally true for the P.D.S. The input circuits used in the P.D.S. usually have a frequency range from 50 to 220 kHz and therefore radio and other continuous interference in this range can enter the P.D.S.logic. any such radio interference will in general enter the circuit from the outside and will thus present in-phase signals at the amplifier outputs. Whilst these in-phase signals will not of course be recorded by the P.D.S., they can trigger the logic and therefore cause a serious loss in the number of discharge pulses with which the system can cope as a result in effect of the discharge pulses being lost beneath the level of interference.

It is an object of the present invention to provide a technique for use in pulse detection systems such as the P.D.S. wherein the level of interference which can be tolerated is increased whilst at the same time also enabling the pulse detection sensitivity to be increased.

In accordance with one aspect of the present invention there is provided a noise reduction technique wherein two discrete signals $\overline{A},\overline{B}$ are separately established, each of which contains the same noise, and wherein, in order to reduce the noise level, the signal $\overline{P}=\overline{A}-N\overline{B}$ is established, with N chosen to make $\overline{P}$ a minimum.

In accordance with a second aspect of the present invention there is provided a technique for use in increasing the sensitivity of a pulse detection system of the type described in GB No. 1425825, wherein signals A and B obtained from two monitoring units in series with respective components ($C_A$, $C_B$) are operated on by a difference amplifier arrangement to establish input signals P and Q for the pulse detection system given by:

$$\overline{P}=(\overline{A}-\alpha N\overline{B}) \text{ and } \overline{Q}=(N\overline{B}-\alpha\overline{A}),$$

where $\alpha$ lies in the range of 0.5 to 1.0 and N is chosen to make the difference signal $(\overline{A}-NB)$ a minimum.

The invention is described further hereinafter, by way of example only, with reference to the accompanying drawings, in which.

Figure 1:
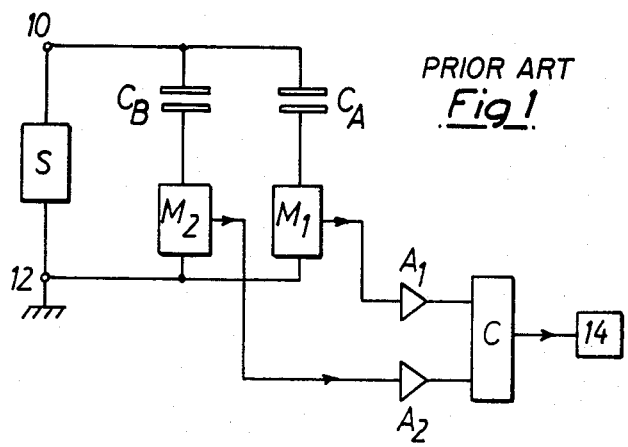
FIG. 1 is a basic circuit diagram of one embodiment of the Pulse Discrimination System (P.D.S.) of GB No. 1425825.

With reference to FIG. 1, the illustrated embodiment of the basic Pulse Discrimination System (P.D.S) of GB No. 1425825 comprises a pair of terminals 10,12 connected to a high-voltage A.C. source S. A component to be tested, in this case a capacitor $C_A$, is connected between the terminals 10,12 in series with a monitoring unit $M_1$ comprising a series impedance formed by the parallel combination of an inductor or capacitor and a damping resistor. In the illustrated embodiment, the terminal 12 is at earth potential and the monitoring unit $M_1$ produces at its output a voltage which is dependent at any instant upon the supply potential and the characteristics of the test component $C_A$. Thus, in the event of a partial discharge in the dielectric of the capacitor $C_A$, a transient pulse appears at the output of the monitoring unit $M_1$.

A second component $C_B$ (normally a reference component) is similarly connected between the terminals 10,12 in series with a second monitoring unit $M_2$. The outputs of the monitoring units $M_1$, $M_2$ are fed via respective amplifiers $A_1$, $A_2$ to the two inputs of a comparator C which is arranged to produce an output signal only if pulses of opposite polarity are present simultaneously at its two inputs. The output of the comparator would normally be fed to a display unit 14, to give a simple indication of the number and amplitude of partial discharges occurring in the component $C_A$ or it could give an indication of all partial discharges in the event that both of the components $C_A$ and $C_B$ are to be tested.

As explained already above, a problem in practice with this basic arrangement is that the amplifiers $A_1$, $A_2$ have a frequency range from about 50 to 220 kHz so that radio and other continuous interference can enter the P.D.S. logic (in this case the comparator C). This results in a limit to the sensitivity of the apparatus since many pulses of interest are of such a low magnitude as to be effectively hidden and lost within the background interference.

Figure 2:
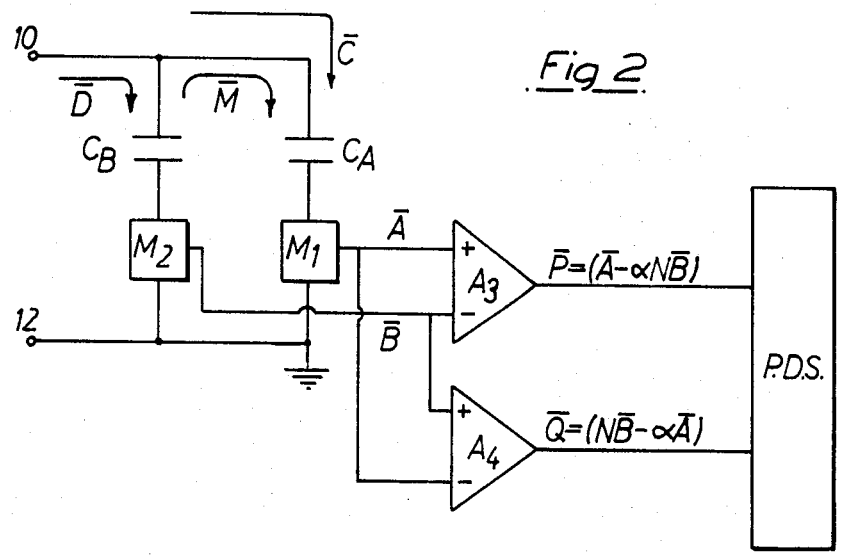
FIG. 2 is a basic circuit diagram showing the P.D.S. of GB No. 1425825 modified in accordance with the present invention.

FIG. 2 shows the basic arrangement of FIG. 1 modified in accordance with the present noise reduction technique. Identical parts are given the same reference numerals. FIG. 2 illustrates the manner in which continuous interference (either sinusoidal or modulated) enters the measuring circuit through the test components $C_A$ and $C_B$. These signals are represented by the phasors $\overline{C}$ and $\overline{D}$. There is also an inductively-induced voltage $\overline{M}$ but this will be considered further below and is considered to be negligible for the moment. The output signals from the two measuring units $M_1$, $M_2$ are represented by phasors $\overline{A}$ and $\overline{B}$, respectively. The signal $\overline{A}$ is applied to the non-inverting input of a first variable gain differential amplifier $A_3$ and to the inverting input of a second variable gain differential amplifier $A_4$. The signal $\overline{B}$ is applied to the inverting input of amplifier $A_3$ and to the non-inverting input of the amplifier $A_4$.

The outputs $\overline{P}$, $\overline{Q}$ of the two amplifiers $A_3$, $A_4$ are arranged to give partial difference signals given respectively by:

$$\overline{P} = (\overline{A} - \alpha N \overline{B})$$

and $$\overline{Q} = (N\overline{B} - \alpha \overline{A})$$

where $\alpha$ is in the range of 0.5 to 1.0. This has the effect that signals on channel B are inverted and added to the signals on channel A to give output P so that in-phase signals on the two channels are attenuated but any anti-phase signals (i.e. those that are being sought) are amplified. Likewise the signals on channel A are inverted and added to the signals on channel B to give output Q so that again in-phase signals are attenuated and out of phase signals are amplified. By consideration of the two quantities $\overline{P}$ and $\overline{Q}$, information on the relative polarities of "internal" and "external" signals is preserved so that the P.D.S. located downstream of the amplifiers $A_3$, $A_4$ may be used to improve the signal/noise ratio and to distinguish the origin of discharges between $C_A$, $C_B$ and "external" sources.

The reasons for the inclusion of the factors $\alpha$ and N are as follows:

The multiplying factor $\alpha$ is included to ensure that the outputs $\overline{P}$ and $\overline{Q}$ never generate anti-phase outputs for in-phase inputs as a result of noise cancelling. Although the latter factor limits the ultimate efficiency, it is important for the operation of the P.D.S. that the latter situation should not occur as it could of course lead to such signals being wrongly interpreted by the P.D.S. as signals originated in the test components $C_A$ or $C_B$. In practice it has been found experimentally that $\alpha$ should lie within the range of 0.5 to 1.0, with a value at or near 0.85 being preferred.

In practice $C_A$ and $C_B$ may not be equal, so that the common mode signals $\overline{C}$ and $\overline{D}$ are also unequal. The multiplying factor N is included for the purpose of balancing out any difference in the values of $C_A$ and $C_B$ and hence the magnitude of the signals seen in channels A and B. Thus:

Ideally $N = C_A/C_B$

In practise it may be difficult to set N exactly to this value but as long as N is within the range $\alpha C_A/C_B$ and $1/\alpha C_A/C_B$, zero phase difference due to the common mode signals is preserved. If N is set outside these limits, then there will be a phase difference of up to 180° between $\overline{P}$ and $\overline{Q}$, thus causing the P.D.S. to record "external" signals. However, within the aforegoing constraints, the value of N is chosen so that the difference signal $(\overline{A} - N\overline{B})$ is a minimum.

Figure 3:
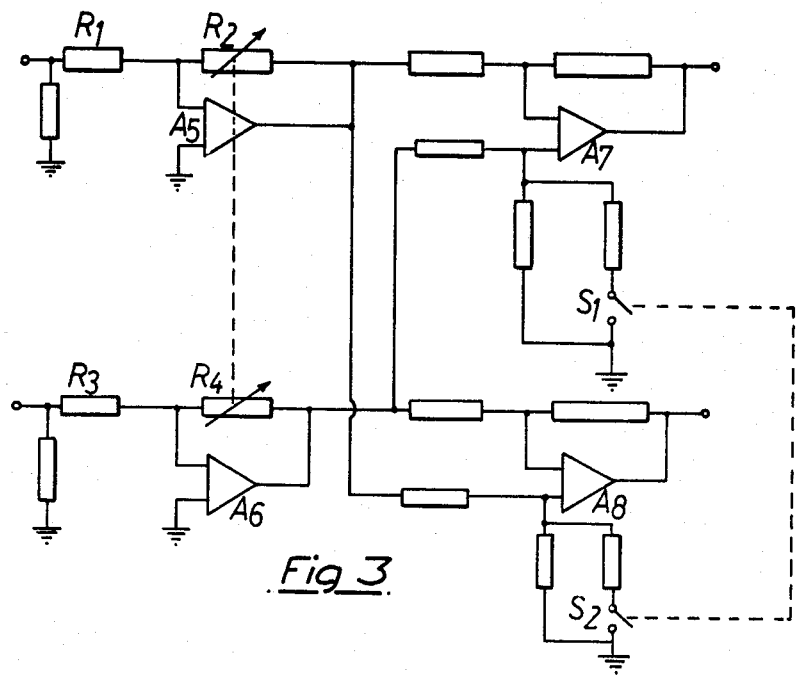
FIG. 3 is a circuit diagram of the embodiment of a difference amplifier arrangement for the system of FIG. 2.

FIG. 3 shows the circuit of one possible embodiment of the difference amplifier arrangement $A_3$, $A_4$. This comprises four identical operational amplifiers $A_5$, $A_6$, $A_7$, $A_8$. The gains of amplifiers $A_5$ and $A_6$ are $R_2/R_1$ and $R_4/R_3$ and are adjustable by varying resistors $R_2$ and $R_4$. By using a ganged potentiometer and arranging that $R_2$ increases when $R_4$ decreases, one may adjust the ratio of signals fed to the difference amplifiers $A_7$ and $A_8$ and hence compensate for various values of N. By adjusting the variable resistors, one may set the output $\overline{P}$ to be a minimum, when it will be $(\overline{A} - N\overline{B})$. Closing switch S then produces an output at P of $(\overline{A} - 0.8N\overline{B})$ as required, with $\alpha = 0.8$.

Difference amplifier $A_8$ gives an equal but opposite output to amplifier $A_7$ when the ganged switches $S_1$ and $S_2$ are open. On closing the latter switches, one gets an output at Q of $(N\overline{B} - 0.8\overline{A})$. The circuit allows N to be varied over a wide range from around 0.01 up to 100 (subject to the condition $\alpha C_A/C_B < N < 1/\alpha C_A/C_B$, thus enabling the circuit to cope with a wide range of capacitance ratios.

Turning now to the question of the inductively induced signal $\overline{M}$ of FIG. 2, it is important that any such signal should be eliminated as the P.D.S. views inductively induced signals as internal discharges.

It is found in practice that small induced signals can be counterbalanced by common-mode signals if the induced signal is relatively small compared with the common mode signal (say about 10-15% of it).

Figure 4:
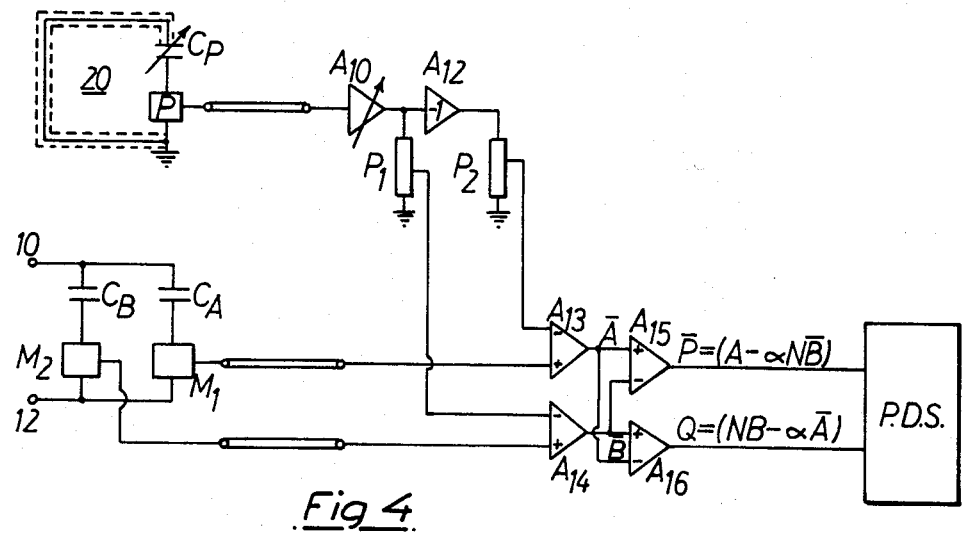
FIG. 4 is a basic circuit diagram illustrating one means of reducing the effects of inductively induced signals in the measuring system.

An alternative way of eliminating the induced signals is to use an adjacent aerial loop to pick up a similar signal and to subtract this signal from the signals from the measuring units. FIG. 4 shows one embodiment of an arrangement which combines the difference technique for the reduction of common mode signals with the subtraction method for eliminating any inductively-induced signals.

An inductive loop 20 is placed in a plane parallel to the loop formed by the test circuit and this is connected to the measuring unit P via a capacitor $C_p$. The induced signals are then led to an amplifier $A_{10}$ whose gain is such as to provide a suitable signal for subtraction. Appropriate signals are then subtracted from the signals from measuring units $M_1$ and $M_2$ by means of amplifiers $A_{13}$, $A_{14}$. Adjustments are made such that the induced signals $\overline{A}$ and $\overline{B}$ are a minimum. It is necessary to subtract the correct magnitude and phase of voltage, the phase being adjustable by setting the value of $C_p$. Amplifiers $A_{15}$ and $A_{16}$ enable the differential technique described above to be used on the signals $\overline{A}$, $\overline{B}$.

It should be emphasised that the present invention is not limited to its use in conjunction with the Pulse Discrimination System (PDS) of GB No. 1425825 and it can be used independently of the PDS as a noise reduction technique. However, when used in conjunction with the PDS it has been found that small discharges can be measured in the presence of continuous modulated or unmodulated interference of a level of up to fifty times the level of the measured discharge.

I claim:

1. In a method of pulse detection of the type wherein signals $(\overline{A})$ and $(\overline{B})$ obtained from two monitoring units $(M_1, M_2)$ in series with respective components $(C_A, C_B)$ are compared in order to detect the occurrence of out of phase pulses in said signals, a method of increasing the sensitivity of pulse detection comprising applying the signals $(\overline{A})$ and $(\overline{B})$ obtained from the monitoring units to difference amplifier means to establish input signals $(\overline{P})$ and $(\overline{Q})$ for the pulse detection system given by:
$\overline{P} = (\overline{A} - \alpha N\overline{B})$ and $\overline{Q} = (N\overline{B} - \alpha\overline{A})$ wherein $\alpha$ lies in the range of 0.5 to 1.0 and N is chosen to make the difference signal $(\overline{A} - N\overline{B})$ a minimum.

2. In a pulse detection system of the type wherein signals $(\overline{A})$ and $(\overline{B})$ obtained from two monitoring units $(M_1, M_2)$ in series with respective components $(C_A, C_B)$ are compared in a pulse discrimination device in order to detect the occurrence of out of phase pulses in said signals, the improvement comprising difference amplifier means coupled to said monitoring units for providing input signals $(\overline{P})$ and $(\overline{Q})$ for the pulse discrimination device given by: $\overline{P} = (\overline{A} - \alpha N\overline{B})$ and $\overline{Q} = (N\overline{B} - \alpha\overline{A})$ wherein $\alpha$ lies in the range of 0.5 to 1.0 and (N) is chosen to make the difference signal $(\overline{A} - N\overline{B})$ a minimum.

3. In a pulse detection system according to claim 2 the further improvement comprising first and second amplifiers receiving, respectively, the signals $(\overline{A})$ and $(\overline{B})$, and means for controlling the gains of said first and second amplifiers so that as one is increased the other is decreased proportionately, and vice versa to set the value of (N).

4. In a pulse detection system according to claim 2 the further improvement comprising first and second voltage dividers, for passing a fraction $\alpha N\overline{B}$ and $\alpha\overline{A}$, respectively, of the two difference signal inputs ($N\overline{B}$ and $\overline{A}$) to be subtracted in the difference amplifier means to the inputs of the difference amplifier means.

5. In a pulse detection system according to claim 2 the further improvement comprising an aerial loop pick up means for eliminating any inductively induced signal component $(\overline{M})$ appearing in the signals $(\overline{A})$ and $(\overline{B})$, said aerial loop pick up means being disposed so as to pick up a similar signal to be amplified and subtracted from the signals $(\overline{A})$ and $(\overline{B})$ to eliminate said inductively induced signal component $(\overline{M})$.

* * * * *